(12) United States Patent
Allen et al.

(10) Patent No.: US 10,242,873 B2
(45) Date of Patent: Mar. 26, 2019

(54) RF POWER COMPENSATION TO CONTROL FILM STRESS, DENSITY, RESISTIVITY, AND/OR UNIFORMITY THROUGH TARGET LIFE

(71) Applicant: APPLIED MATERIALS, INC., Santa Clara, CA (US)

(72) Inventors: Adolph Miller Allen, Oakland, CA (US); Zhenbin Ge, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 525 days.

(21) Appl. No.: 14/640,881

(22) Filed: Mar. 6, 2015

(65) Prior Publication Data

US 2015/0252467 A1 Sep. 10, 2015

Related U.S. Application Data

(60) Provisional application No. 61/949,212, filed on Mar. 6, 2014, provisional application No. 61/949,398, filed on Mar. 7, 2014.

(51) Int. Cl.
| | |
|---|---|
| C23C 14/35 | (2006.01) |
| H01L 21/033 | (2006.01) |
| C23C 14/06 | (2006.01) |
| H01L 21/285 | (2006.01) |
| H01L 21/311 | (2006.01) |

(52) U.S. Cl.
CPC ...... *H01L 21/0338* (2013.01); *C23C 14/0641* (2013.01); *C23C 14/354* (2013.01); *H01L 21/2855* (2013.01); *H01L 21/31144* (2013.01)

(58) Field of Classification Search
CPC ............ C23C 14/3492; C23C 14/0641; C23C 14/354; H01L 21/0338; H01L 21/2855; H01L 21/31144
USPC .......................... 204/192.12, 298.06, 298.08
See application file for complete search history.

(56) References Cited

U.S. PATENT DOCUMENTS

| | | | | |
|---|---|---|---|---|
| 2005/0006222 A1* | 1/2005 | Ding | ..................... | C23C 14/358 204/192.1 |
| 2010/0252417 A1* | 10/2010 | Allen | .................... | C23C 14/345 204/192.12 |
| 2014/0174909 A1* | 6/2014 | Klimczak | ........... | H01J 37/3405 204/192.11 |

* cited by examiner

*Primary Examiner* — Rodney G McDonald
(74) *Attorney, Agent, or Firm* — Moser Taboada; Alan Taboada

(57) ABSTRACT

Methods for depositing a metal-containing layer atop a substrate disposed in a PVD chamber are provided herein. In some embodiments, such a method includes: providing a plasma forming gas to a processing region of the PVD chamber; providing a first amount of RF power to a target assembly disposed opposite the substrate to form a plasma within the processing region of the PVD chamber; sputtering source material from the target assembly to deposit a metal-containing layer onto the substrate, wherein the source material is at a first erosion state; and increasing the first amount of RF power provided to the target assembly by a predetermined amount while sputtering the source material, wherein the predetermined amount is determined by a second amount of RF power provided to the target assembly to maintain a desired ionization rate of source material at a second erosion state.

17 Claims, 2 Drawing Sheets

RF POWER COMPENSATION TO CONTROL FILM STRESS, DENSITY, RESISTIVITY, AND/OR UNIFORMITY THROUGH TARGET LIFE

CROSS-REFERENCE TO RELATED APPLICATIONS

This application claims benefit of U.S. provisional patent application Ser. No. 61/949,212, filed Mar. 6, 2014, and U.S. provisional patent application Ser. No. 61/949,398, filed Mar. 7, 2014, each of which is herein incorporated by reference.

FIELD

Embodiments of the present disclosure generally relate to methods of processing semiconductor devices

BACKGROUND

Sputtering, alternatively called physical vapor deposition (PVD), is used in depositing metals and related materials in the fabrication of semiconductor integrated circuits. For example, high density, low stress titanium nitride (TiN) films have typically been used for back end of line (BEOL) hard mask applications in order to reduce line bending for patterned low k dielectric trenches as well as to improve low k etching profiles by reducing line edge roughness and critical dimension (CD) variation.

Typical PVD processes sputter material from a target using a plasma formed by supplying RF power to the target in conjunction with magnetic confinement at the target surface. However, a drawback observed by the inventors of using RF power supplied to the target is that the effectiveness of the RF power delivery is diminished as the target material erodes. The inventors believe that the diminishing effectiveness of the RF power is due to the fact that the physical distance from the surface of the magnet to the sputtering surface of the target decreases as the target thins. As the magnetic confinement increases, the electrons supplied by the RF current cannot propagate as efficiently into the plasma as they follow the strengthening (as a function of erosion depth) magnetic field lines.

The reduction in RF power delivered to the plasma reduces the ionization rate, which can be seen directly by a decrease in the RF current measured at a substrate support impedance circuit and indirectly by the impact on film properties. The advantageous film properties associated with higher ionization, namely low stress and high density, start to deteriorate as a function of target life due to the increase magnetic confinement.

Thus, the inventors have provided embodiments of methods that can advantageously be used to deposit materials while improving film properties.

SUMMARY

Methods for depositing a metal-containing layer atop a substrate disposed in a PVD chamber are provided herein. In some embodiments, a method of depositing a metal-containing layer atop a substrate disposed in a physical vapor deposition process (PVD) chamber includes: providing a plasma forming gas to a processing region of the PVD chamber; providing a first amount of RF power to a target assembly disposed opposite the substrate to form a plasma within the processing region of the PVD chamber; sputtering source material from the target assembly to deposit a metal-containing layer onto the substrate, wherein the source material is at a first erosion state; and increasing the first amount of RF power provided to the target assembly by a predetermined amount while sputtering the source material, wherein the predetermined amount is determined by a second amount of RF power provided to the target assembly to maintain a desired ionization rate of source material at a second erosion state.

In some embodiments, a method of forming a titanium nitride layer atop a substrate disposed in a physical vapor deposition process (PVD) chamber includes: providing a nitrogen gas to a processing region of the PVD chamber; providing a first amount of RF power to a target assembly disposed opposite the substrate to form a plasma within a processing region of the PVD chamber; sputtering titanium source material from the target assembly to deposit a titanium nitride layer onto the substrate, wherein the titanium source material is at a first erosion state; increasing the first amount of RF power provided to the target assembly by a predetermined amount while sputtering the titanium source material, wherein the predetermined amount is determined by a second RF amount provided to the target assembly to maintain a desired ionization rate of titanium source material at a second erosion state; and tuning a substrate support impedance circuit while sputtering the titanium source material to maintain a constant RF current at a substrate level.

In some embodiments, a computer readable medium is provided having instructions stored thereon that, when executed, cause a method to be performed for depositing a metal-containing layer atop a substrate disposed in a physical vapor deposition (PVD) process chamber having a target assembly disposed in the PVD process chamber. The method may include any of the embodiments disclosed herein.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
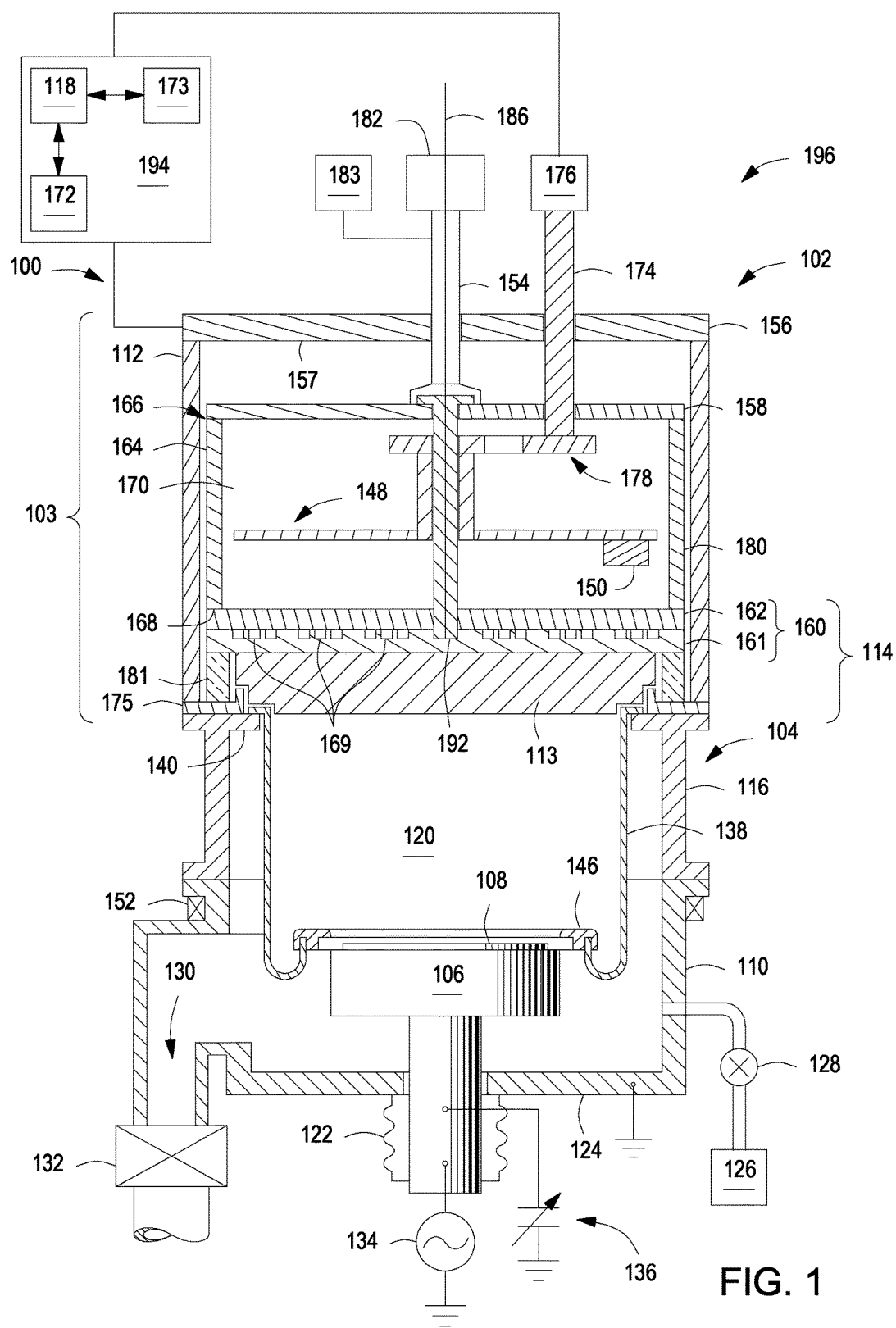
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure relates to methods of depositing a metal-containing layer atop a substrate disposed in a physical vapor deposition process (PVD) chamber. The inventive methods described herein advantageously facilitate the deposition of a metal-containing layer suitable as a hard mask layer, for example a titanium nitride layer, having advantageous stress, resistivity and density uniformity properties.

Figure 2:
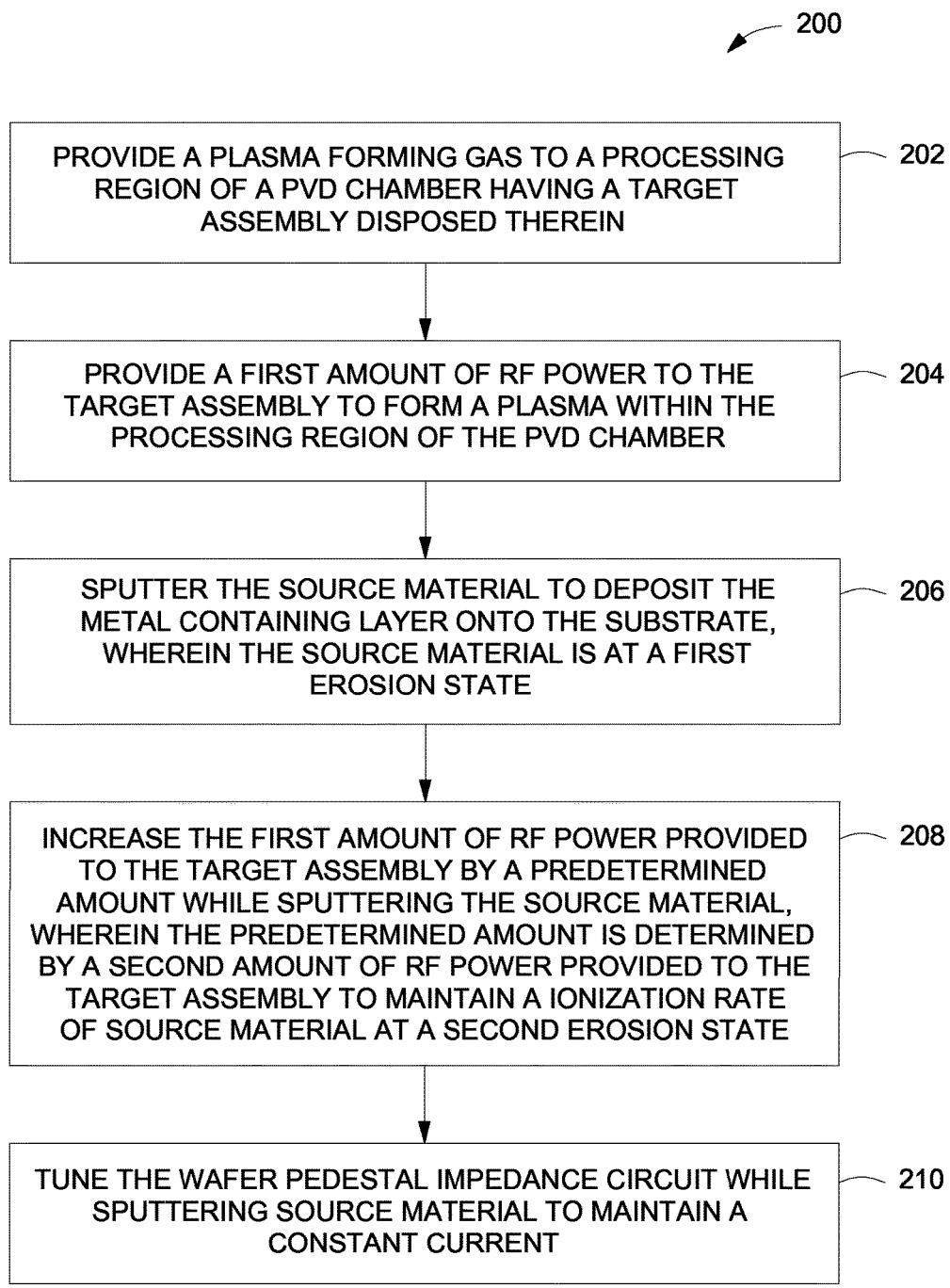
FIG. 2 depicts a flow chart for a method of processing a substrate in accordance with some embodiments of the present disclosure.

FIG. 1 depicts a simplified, cross-sectional view of a physical vapor deposition (PVD) processing system 100, in accordance with some embodiments of the present disclosure. FIG. 2 depicts a flow chart of a method 200 for depositing a layer atop a substrate disposed in a physical vapor deposition process system of the type described in FIG. 1. Examples of other PVD chambers suitable for performing the method 200 described herein include the CIRRUS™ and AVENIR™ PVD processing chambers, both commercially available from Applied Materials, Inc., of Santa Clara, Calif.

The method 200 begins by providing a substrate 108 to a PVD process chamber, for example the process chamber 104 shown in FIG. 1. The process chamber 104 depicted in FIG. 1 comprises a substrate support 106, a target assembly 114 having an optional backing plate assembly 160 and source material 113 which is disposed on a substrate support facing side of the backing plate assembly 160. As described below with respect to FIG. 1, the process chamber 104 further comprises an RF power source 182 to provide RF energy to the target assembly.

The substrate 108 may be any suitable substrate having any suitable geometry, such as a round wafer, square, rectangular, or the like. The substrate 108 may comprise any suitable materials, such as one or more of silicon (Si), silicon oxide ($SiO_2$), silicon nitride (SiN), glass, other dielectric materials, or the like, and may have one or more layers of other materials disposed atop the substrate 108. In some embodiments, the substrate 108 may include an upper layer of a low k dielectric material, and in some embodiments, an ultra-low k dielectric material. As used herein ultra-low k dielectric materials include dielectric materials having a k value of less than or equal to about 2.5 The substrate 108 may be a blank substrate (e.g., having no features disposed on the substrate), or the substrate 108 may have features formed in or on the substrate, such as vias or trenches, or high aspect ratio features, for example, for through silicon via (TSV) applications or the like. A high aspect ratio feature as used herein may include those features having a height to width aspect ratio of at least about 5:1 (e.g., a high aspect ratio).

At 202, a plasma forming gas is provided to a processing region 120 of the process chamber 104. The plasma-forming gas may include one or more inert gases, such as a noble gas, or other inert gases. For example, non-limiting examples of suitable plasma forming gases include one or more of argon (Ar), helium (He), xenon (Xe), neon (Ne), hydrogen ($H_2$), nitrogen ($N_2$), oxygen ($O_2$). or the like.

At 204, a first amount of RF power is provided to the target assembly 114 to ignite the plasma-forming gas into a plasma within the processing region 120 of the process chamber 104. The first amount of RF power is an amount of RF power suitable to form a plasma within the processing region 120 and may vary depending upon chamber size, geometry, or the like. For example, in some embodiments, the first amount of RF power is about 500 to about 20000 watts.

At 206, the source material 113 is sputtered from the target assembly 114 to deposit the metal-containing layer onto the substrate 108. The source material 113 is initially at a first erosion state. In some embodiments, source material 113 at the first erosion state is substantially uneroded (i.e. is at or very near the beginning of the target life). The source material 113 may comprise one or more of metals, metal alloys, or the like, suitable for forming a metal-containing layer on the substrate 108. For example, the source material 113 may comprise one or more of titanium (Ti), tantalum (Ta), copper (Cu), cobalt (Co), tungsten (W), aluminum (Al), or the like. Metal atoms from the source material 113 are sputtered using the plasma while maintaining a first pressure in the PVD chamber. The first pressure is a pressure sufficient to ionize a predominant portion of metal atoms being sputtered from the target. The first pressure may be dependent on process chamber geometry (such as substrate size, target to substrate distance, and the like).

When depositing a metal-containing layer, such as a titanium nitride layer, the inventors have observed that maintaining an increased ionization rate of nitrogen and titanium within the plasma by increasing the RF power delivered to the target assembly as a function of target life allows for improved surface mobility of arriving atoms, providing a preferred crystallographic film orientation that is advantageous for forming low stress and dense films. In addition, increasing the RF power delivered to the target assembly as a function of target life while tuning a substrate support impedance circuit (e.g., capacitance tuner 136 described below with respect to FIG. 1) to control substrate current (e.g., ion energy at the substrate level), further advantageously facilitates control over the crystallographic film orientation that is advantageous for forming low stress and dense films.

Thus, at 208, while sputtering the source material 113, the amount of RF power provided to the target assembly is increased by a predetermined amount calculated to maintain a desired ionization rate of source material 113 as the source material erodes. For example, the predetermined amount may be determined by determining the amount of RF power (i.e., a second RF amount) suitable for maintaining a predetermined ionization rate of source material 113 when the source material 113 is at a second erosion state (e.g., more eroded than the first erosion state). Alternatively, for example, the predetermined amount may be determined by determining the amount of RF power (i.e., a second RF amount) suitable for maintaining the ionization rate of source material 113 when at the second erosion state to be within a predetermined tolerance or range of an initial ionization rate of source material 113 (e.g., when the source material 113 is at the first erosion state).

The desired ionization rate may vary depending upon the application. For example, in some embodiments, the ionization rate may be held constant, substantially constant, or within a predetermined range as the target erodes from the first erosion state to the second erosion state. For example, in some embodiments, the ionization rate can be controlled to be within about +/−10% over the life of the target (e.g., in a non-limiting example where the resistivity of the deposited material is controlled to within an about +/−10% range). In some embodiments, the ionization rate can be controlled to be within about +/−5% over the life of the target (e.g., in a non-limiting example where the resistivity of the deposited material is controlled to within an about +/−5% range). In some embodiments, the ionization rate can be controlled to be within about +/−3% over the life of the target (e.g., in a non-limiting example where the film stress of the deposited material is controlled to within an about +/−10% range). In some embodiments, the ionization rate can be controlled to be within about +/−1.5% over the life of the target (e.g., in a non-limiting example where the film stress of the deposited material is controlled to within an about +/−5% range).

The determination of the second amount of RF power may be determined empirically or by modeling. In some embodiments, the source material 113 at the second erosion state is substantially eroded (i.e. is at or very near the end of the target life). In some embodiments, the RF power applied to the target assembly 114 is increased at a linear rate from the first amount at the first erosion state to the second amount at the second erosion state.

Optionally, a secondary energy source 183 coupled to the target assembly 114 may provide DC power to the target assembly 114 to direct the plasma towards the target assembly 114. In some embodiments, the DC power may range from about 1 to about 20 kilowatts (kW), although the amount of DC power applied may vary depending upon chamber geometry (e.g., target size or the like). In some embodiments, the DC power may also be adjusted over the life of the target in the same manner as described above for the RF power. The DC power may be adjusted to control the deposition rate of sputtered metal atoms on the substrate. For example, increasing the DC power can result in increased interaction of the plasma with the target and increased sputtering of metal atoms from the target. In some embodiments, the DC power may be adjusted to maintain a ratio of DC power to RF power of about 2:1 to about 10:1.

At 210, the substrate support impedance circuit may be tuned to control the ion energy at the substrate level while sputtering source material 113. At 210, the substrate support impedance circuit may be tuned to maintain a constant RF current (e.g., ion energy at the substrate level) while sputtering source material 113. The high fraction of ionized material arriving at the substrate level due to increasing the RF power over the life of the target allows for tuning of the incoming ion energy by means of a substrate support impedance circuit. In some embodiments, the substrate support impedance circuit is tuned to maintain a constant RF current of about 2 to about 5 amps.

Returning to FIG. 1, the PVD processing system 100 includes a chamber lid 102 removably disposed atop a process chamber 104. The chamber lid 102 may include a target assembly 114 and a grounding assembly 103. The process chamber 104 contains a substrate support 106 for receiving a substrate 108. The substrate support 106 may be located within a lower grounded enclosure wall 110, which may be a chamber wall of the process chamber 104. The lower grounded enclosure wall 110 may be electrically coupled to the grounding assembly 103 of the chamber lid 102 such that an RF return path is provided to an RF power source 182 disposed above the chamber lid 102. The RF power source 182 may provide RF energy to the target assembly 114 as discussed below. Alternatively or in combination a DC power source may be similarly coupled to target assembly 114.

The PVD processing system 100 may include a source distribution plate 158 opposing a backside of the target assembly 114 and electrically coupled to the target assembly 114 along a peripheral edge of the target assembly 114. The PVD processing system 100 may include a cavity 170 disposed between the backside of the target assembly 114 and the source distribution plate 158. The cavity 170 may at least partially house a magnetron assembly 196 as discussed below. The cavity 170 is at least partially defined by the inner surface of a conductive support ring 164, a target facing surface of the source distribution plate 158, and a source distribution plate facing surface (e.g., backside) of the target assembly 114 (or backing plate assembly 160).

The PVD processing system 100 further includes a magnetron assembly 196. The magnetron assembly 196 provides a rotating magnetic field proximate the target to assist in plasma processing within the process chamber 104. The magnetron assembly includes a rotatable magnet assembly 148 disposed within the cavity 170. The rotatable magnet assembly 148 rotates about a central axis 186 of the process chamber 104.

In some embodiments, the magnetron assembly 196 includes a motor 176, a motor shaft 174, a gear assembly 178, and the rotatable magnet assembly 148. The rotatable magnet assembly 148 includes a plurality of magnets 150 and is configured to rotate the plurality of magnets 150 about the central axis 186 as described below. The motor 176 may be an electric motor, a pneumatic or hydraulic drive, or any other process-compatible mechanism that can provide suitable torque. While one illustrative embodiment is described herein to illustrate how the rotatable magnet assembly 148 may be rotated, other configurations may also be used.

In use, the magnetron assembly 196 rotates the rotatable magnet assembly 148 within the cavity 170. For example, in some embodiments, the motor 176, motor shaft 174, and gear assembly 178 may be provided to rotate the rotatable magnet assembly 148. In some embodiments, the electrode 154 is aligned with the central axis 186 of the process chamber 104, and motor shaft 174 of the magnetron may be disposed through an off-center opening in the ground plate 156. The end of the motor shaft 174 protruding from the ground plate 156 is coupled to the motor 176. The motor shaft 174 is further disposed through an off-center opening in the source distribution plate 158 and coupled to a gear assembly 178.

The gear assembly 178 may be supported by any suitable means, such as by being coupled to a bottom surface of the source distribution plate 158. The gear assembly 178 may be insulated from the source distribution plate 158 by fabricating at least the upper surface of the gear assembly 178 from a dielectric material, or by interposing an insulator layer (not shown) between the gear assembly 178 and the source distribution plate 158, or the like, or by constructing the motor shaft 174 out of suitable dielectric material. The gear assembly 178 is further coupled to the rotatable magnet assembly 148 to transfer the rotational motion provided by the motor 176 to the rotatable magnet assembly 148. The gear assembly 178 may be coupled to the rotatable magnet assembly 148 through the use of pulleys, gears, or other suitable means of transferring the rotational motion provided by the motor 176.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a processing region 120 of the process chamber 104. The processing region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a suitable pressure inside the process chamber 104.

In some embodiments, an RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In some embodiments, RF bias power may be supplied in a range from about 100 W to 2 kW. In some embodiments, DC power may be supplied in range from about 2 kW to about 40 kW. In other applications, the substrate support 106 may be grounded or left electrically floating. Alternatively or in combination, a substrate support impedance circuit, such as a capacitance tuner 136, may be coupled to the substrate support 106 for adjusting voltage on the substrate 108. For example, the substrate support impedance circuit may be used to control the voltage on the substrate 108, and thus, the substrate current (e.g., ion energy at the substrate level), The process chamber 104 further includes a process kit shield, or shield, 138 to surround the processing volume, or central region, of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber lid 102 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 102. However, other RF return paths are possible, such as via the grounded shield 138.

The shield 138 extends downwardly and may include a generally tubular portion having a generally constant diameter that generally surrounds the processing region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 146 rests on the top of an upwardly extending inner portion of the shield 138 when the substrate support 106 is in the lower, loading position but rests on the outer periphery of the substrate support 106 when the substrate support 106 is in the upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 for selectively providing a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 102 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extending from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, and the target assembly 114. The seal ring 181 may be a ring or other annular shape having a suitable cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The support member 175 may be a generally planar member having a central opening to accommodate the target assembly 114. In some embodiments, the support member 175 may be circular, or disc-like in shape, although the shape may vary depending upon the corresponding shape of the chamber lid and/or the shape of the substrate to be processed in the PVD processing system 100.

The target assembly 114 may comprise a source material 113 to be deposited on a substrate, such as the substrate 108 during sputtering, such as a metal, metal oxide, metal alloy, or the like. In some embodiments, the target assembly 114 may be fabricated substantially from the source material 113, without any backing plate to support the source material 113. In some embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In some embodiments, the backing plate assembly 160 includes a first backing plate 161 and a second backing plate 162. The first backing plate 161 and the second backing plate 162 may be disc shaped, rectangular, square, or any other shape that may be accommodated by the PVD processing system 100. A front side of the first backing plate 161 is configured to support the source material 113 such that a front surface of the source material opposes the substrate 108 when present. The source material 113 may be coupled to the first backing plate 161 in any suitable manner. For example, in some embodiments, the source material 113 may be diffusion bonded to the first backing plate 161.

A plurality of sets of channels 169 may be disposed between the first and second backing plates 161, 162. The first and second backing plates 161, 162 may be coupled together to form a substantially water tight seal (e.g., a fluid seal between the first and second backing plates) to prevent leakage of coolant provided to the plurality of sets of channels 169. In some embodiments, the target assembly 114 may further comprise a central support member 192 to support the target assembly 114 within the process chamber 104.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF power source 182 connected to an electrode 154 (e.g., a RF feed structure). The electrode 154 may pass through the grounding plate 156 and is coupled to the source distribution plate 158. The RF power source 182 may include an RF generator and a matching circuit, for example, to minimize reflected RF energy reflected back to the RF generator during operation. For example, RF energy supplied by the RF power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the process chamber 104 (e.g., the electrode 154 may be coupled to the target assembly at a point coincident with a central axis of the target, which is coincident with the central axis 186). The electrode 154, aligned with the central axis 186 of the process chamber 104, facilitates applying RF energy from the RF power source 182 to the target assembly 114 in an axisymmetrical manner (e.g., the electrode 154 may couple RF energy to the target at a "single point" aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

A controller 194 may be provided and coupled to various components of the PVD processing system 100 to control the operation of the system. The controller 194 includes a central processing unit (CPU) 118, a memory 172, and support circuits 173. The controller 194 may control the PVD processing system 100 directly, or via computers (or controllers) associated with particular process chamber and/or support system components. The controller 194 may be one of any form of general-purpose computer processor that can be used in an industrial setting for controlling various chambers and sub-processors. The memory, or computer readable medium, 172 of the controller 194 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 173 are coupled to the CPU 118 for supporting the processor in a conventional manner. These circuits include cache, power supplies, clock circuits, input/output circuitry and subsystems, and the like. Inventive methods as described herein may be stored in the memory 264 as software routine that may be executed or invoked to control the operation of the PVD processing system 100 in the manner described herein. The software routine may also be stored and/or executed by a second CPU (not shown) that is remotely located from the hardware being controlled by the CPU 118.

While the foregoing is directed to embodiments of the present disclosure, other and further embodiments of the disclosure may be devised without departing from the basic scope thereof.

The invention claimed is:

1. A method of depositing a metal-containing layer atop a substrate disposed in a physical vapor deposition process (PVD) chamber, comprising:
   forming a plasma from a plasma forming gas in a processing region of the PVD chamber;
   sputtering source material from a target assembly disposed opposite the substrate to deposit a metal-containing layer onto the substrate, wherein a first amount of RF power is provided to the target assembly to provide a desired ionization rate of source material while the source material is at a first erosion state; and
   increasing the first amount of RF power provided to the target assembly by a predetermined amount while sputtering the source material, wherein the predetermined amount is calculated to maintain the desired ionization rate of source material as the source material erodes to a second erosion state.

2. The method of claim 1, further comprising:
   tuning a substrate support impedance circuit to maintain a constant RF current at a substrate level.

3. The method of claim 1, wherein source material at the second erosion state is substantially eroded.

4. The method of claim 1, wherein source material at the first erosion state is substantially uneroded.

5. The method of claim 1, wherein the first amount of RF power provided to the target assembly at the first erosion state is increased at a linear rate to a second amount of RF power provided to the target assembly at the second erosion state.

6. The method of claim 1, wherein the source material is one of titanium (Ti), tantalum (Ta), copper (Cu), cobalt (Co), tungsten (W), or aluminum (Al).

7. The method of claim 1, wherein the plasma forming gas comprises one or more of argon (Ar), helium (He), xenon (Xe), neon (Ne), hydrogen ($H_2$), nitrogen ($N_2$), oxygen ($O_2$).

8. The method of claim 1, wherein the first amount of RF power is about 500 W to about 20000 W.

9. The method of claim 1, further comprising applying a DC power to the target assembly.

10. The method of claim 9, further comprising applying DC power and RF power to the target assembly at a ratio of about 2:1 to about 10:1.

11. A method of forming a titanium nitride layer atop a substrate disposed in a physical vapor deposition process (PVD) chamber, comprising:
    forming a plasma from a nitrogen gas a processing region of the PVD chamber;
    sputtering titanium source material from a target assembly disposed opposite the substrate to deposit a titanium nitride layer onto the substrate, wherein a first amount of RF power is provided to the target assembly to provide a desired ionization rate of source material while the titanium source material is at a first erosion state;
    increasing the first amount of RF power provided to the target assembly by a predetermined amount while sputtering the titanium source material, wherein the predetermined amount is determined by a second amount of RF power provided to the target assembly to maintain the desired ionization rate of titanium source material as the titanium source material erodes from the first erosion state to a second erosion state; and
    tuning a substrate support impedance circuit while sputtering the titanium source material to maintain a constant RF current at a substrate level.

12. The method of claim 11, wherein the titanium source material at the first erosion state has not been substantially eroded and wherein the titanium source material at the second erosion state has been substantially eroded.

13. The method of depositing a metal-containing layer of claim 1, wherein the first amount of RF power is increased as a function of target life.

14. The method of depositing a metal-containing layer of claim 13, further comprises tuning a substrate support impedance circuit to control substrate current.

15. The method of depositing a metal-containing layer of claim 1, wherein the desired ionization rate is constant.

16. The method of depositing a metal-containing layer of claim 1, wherein the predetermined amount is calculated to maintain the ionization rate of source material when at the second erosion state to be within a predetermined tolerance of an initial ionization rate of source material.

17. The method of depositing a metal-containing layer of claim 1, further comprising controlling the ionization rate to be within about plus or minus 10% of an initial ionization rate over the life of the target.

* * * * *